United States Patent
Chaudhari

(10) Patent No.: US 9,653,696 B2
(45) Date of Patent: *May 16, 2017

(54) TIN PEROVSKITE/SILICON THIN-FILM TANDEM SOLAR CELL

(71) Applicant: Ashok Chaudhari, Briarcliff Manor, NY (US)

(72) Inventor: Ashok Chaudhari, Briarcliff Manor, NY (US)

(73) Assignee: Solar-Tectic LLC, Briarcliff Manor, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 15/205,233

(22) Filed: Jul. 8, 2016

(65) Prior Publication Data

US 2016/0322172 A1    Nov. 3, 2016

Related U.S. Application Data

(60) Provisional application No. 62/333,454, filed on May 9, 2016.

(51) Int. Cl.
| | |
|---|---|
| *H01L 51/42* | (2006.01) |
| *H01L 31/078* | (2012.01) |
| *H01L 27/30* | (2006.01) |

(52) U.S. Cl.
CPC ........ *H01L 51/4213* (2013.01); *H01L 27/302* (2013.01); *H01L 31/078* (2013.01); *H01L 51/4226* (2013.01)

(58) Field of Classification Search
None
See application file for complete search history.

(56) References Cited

U.S. PATENT DOCUMENTS

| | | | |
|---|---|---|---|
| 9,054,249 | B2 | 6/2015 | Chaudhari |
| 9,349,995 | B2 | 5/2016 | Chaudhari |
| 2015/0298161 | A1 | 10/2015 | Beekman et al. |
| 2016/0190377 | A1 | 6/2016 | Green |
| 2016/0254472 | A1 | 9/2016 | Wang et al. |
| 2016/0322167 | A1* | 11/2016 | Chaudhari ........ H01L 31/02366 |

FOREIGN PATENT DOCUMENTS

WO    2016094966 A1    6/2016

OTHER PUBLICATIONS

Tsai et al. "High-efficiency Two-Dimensional Ruddlesden—Popper Perovskite Solar Cells", Nature (2016) [online] Jul. 6, 2016 [retrieved Aug. 5, 2016] Retrieved from the Internet<URL: http://www.nature.com/nature/journal/vaop/ncurrent/full/nature18306.html.

George J. et al. "Preferentially Oriented BaTiO3 Thin Films Depos Silicon with Thin Intermediate Buffer Layers". Nanoscale Research Letters, 2013, vol. 8, pp. 1-7, Springer, USA.

Chaudhari A. "High Efficiency Perovskite/Crystalline Silicon Thin-Film Tandem Solar Cell From a Highly Textured MgO [111] Buffered Glass Substrate: A Proposal", Journal of Energy Challenges and Mechanics, 2016, pp. 1-7, vol. 3, North Sea, UK.

Sivaram, V. et al. "Out-Shining Silicon", Scientific American, Jul. 2015, pp. 54-59., USA.

Chen,Q., et al. "Under the Spotlight: The Organic-Inorganic Hybrid Halide Perovskite for Optoelectronic Applications", Nano Today, Jun. 9, 2015, pp. 355-396, vol. 10, ScienceDirect, Elsevier, USA.

Noel, N. K., et al. "Lead-free Organic-Inorganic Tin Halide Perovskites for Pholtovoltaic Applications", Energy Environ. Sc., Apr. 29, 2014, pp. 3061-3068, vol. 7, The Royal Society of Chemistry, UK.

Snaith, H., "Perovsites: The Emergence of a new Era for Low-Cost, High Efficiency Solar Cells", The Journal of Physical Chemistry Letters, Oct. 10, 2013, pp. 3623-3630, vol. 4, ACS Publications, USA.

Liu, M. et al., "Efficient Planar Heterojunction Perovskite Solar Cells by Vapour Deposition", Nature, Sep. 19, 2013, pp. 395-402, vol. 501, Macmillan Publishers Limited, UK.

Burschka, J. et al. "Sequential Deposition as a Route to High-Performance Perovskite-Sensitized Solar Cells", Nature, Jul. 18, 2013, pp. 316-320, vol. 499, Macmillan Publishers Limited, UK.

Bullis, K."What Tech is Next for the Solar Industry?", MIT Technology Review, Jun. 21, 2013, pp. 1-8, https://www.technologyreview.com/s/516306/what-tech-is-next-for-the-solar-industry/, USA.

McGehee M. et ano. "High-Efficiency Tandem Perovskite Solar Cells", MRS Bulletin,Aug. 2015, pp. 681-686, vol. 40, Journal of Materials Research, USA.

Chaudhari et al. "Heteroepitaxial Silicon Film Growth at 600 C From an Al—Si Eutectic Melt", Thin Solid Films 518, Mar. 2010, pp. 5368-5371, Elsevier, US.

Zeman, M. "Advanced Amorphous Silicon Solar Cell Technologies", Thin Film Solar Cells: Fabrication, Characterization and Applications, 2006, pp. 1-66, John Wiley & Sons Ltd., UK.

Mailoa, J. et al. "A 2-Terminal Perovskite/Silicon Multijunction Solar Cell Enabled by a Silicon Tunnel Junction", Apploed Physics Letters 516, 2015, pp. 1-5, AIP Publishing, USA.

* cited by examiner

*Primary Examiner* — Angel Roman
*Assistant Examiner* — Kevin Quinto
(74) *Attorney, Agent, or Firm* — Carter, Ledyard & Milburn LLP

(57) ABSTRACT

A method of making a non-toxic perovskite/inorganic thin-film tandem solar cell including the steps of depositing a textured oxide buffer layer on an inexpensive substrate, depositing a metal-inorganic film from a eutectic alloy on the buffer layer; and depositing perovskite elements on the metal-inorganic film, thus forming a perovskite layer based on a metal from the metal-inorganic film, incorporating the metal into the perovskite layer.

19 Claims, No Drawings

TIN PEROVSKITE/SILICON THIN-FILM TANDEM SOLAR CELL

This application claims priority to U.S. Provisional Patent Application No. 62/333,454 filed May 9, 2016, entitled "Tin Perovskite/Silicon Thin-Film Tandem Solar Cell" and is hereby incorporated by reference in its entirety.

The present invention relates to non-toxic perovskite/silicon thin-film solar cells, transistors, light emitting diodes, and other electronic devices.

BACKGROUND OF THE INVENTION

In the solar cell technology invented by the late Dr. Praveen Chaudhari, a method is disclosed (U.S. Pat. No. 9,054,249) for making a tandem solar cell in which a "thin-silicon film can be used for heteroepitaxial deposition of other semiconductors, which might be more efficient converters of light to electricity." The material "Perovskites," although not new, has recently been the subject of a tremendous amount of attention in the solar cell technology community due to the quick progress and achievement of high efficiencies demonstrated with regard to light conversion for solar cell purposes over a relatively short period of time. The name 'perovskite solar cell' is derived from the $ABX_3$ crystal structure of the absorber materials, which is referred to as perovskite structure. "Perovskites" is the nomenclature for any materials that adopt the same crystal structure as calcium titanate ($ABX_3$). There are hundreds of different materials that adopt this structure, with a multitude of properties, including insulating, antiferromagnetic, piezoelectric, thermoelectric, semiconducting, conducting, and, probably most famously, superconducting. (H. Snaith "Perovskites: The Emergence of a New Era for Low Cost, High Efficiency Solar Cells", 2013). Nonetheless, thousands of different chemical compositions are possible as perovskites are a wide ranging class of materials in which organic molecules made mostly of carbon and hydrogen bind with a metal such as lead and a halogen such as chlorine in a three dimensional crystal lattice.

Many believe that solar cells will need to have a power conversion efficiency (PCE) around 25% and a cost below $0.5/W to revolutionize how the world's population obtains its electricity. Perovskites' conversion efficiency has increased over the last five years from 4 percent to nearly 20 percent. The theoretical limit of perovskite's conversion efficiency is about 66 percent, compared to silicon's theoretical limit of about 32 percent. The ingredients used to create perovskite are widely available and inexpensive to combine, since it can be done at relatively low temperatures (around 100° C.). While there are many advantages to perovskites, there are also disadvantages. One of the components of the perovskite commonly experimented with—MAPbI—is Pb or lead—a highly toxic metal. And while perovskite based solar cells have not (yet) gained market entry, before they could do so any perovskite solar cells would have to undergo extensive testing to make sure that lead wouldn't be a risk factor. Although researchers have noted that the amount of lead present is relatively low, and would likely have a very minimal negative environmental impact, a perovskite without a toxic metal would be advantageous. Researchers have been able to produce lead-free perovskite cells that swap lead out for tin, which could eliminate the concern entirely. This tin (Sn) perovskite, when combined with another semiconductor material as a layer underneath for a tandem or multi-junction structure, could lead to an ideal non-toxic solar cell capable of solving current energy needs and to combating climate change. There is, however, another challenge. Since perovskite solar cells already have the efficiency that is needed for commercialization and can almost certainly be manufactured at a highly attractive cost, the primary barrier to commercialization is going to be obtaining long-term stability. The challenge appears to be that the films are highly reactive with water and have a tendency to emit methylammonium iodide. This also holds for perovskite/silicon tandem solar cells. As of the date of this disclosure, tandem solar cells with a lead based perovskite and crystalline silicon bottom layer have been fabricated and reported on. For example, methylammonium lead tri-halide perovskite and silicon solar cells can form a complementary pair. With the perovskite solar cell functioning as a top layer, it can harvest the short wavelength photons while the bottom layer coated with silicon is designed to absorb the long wavelength photons. As there are different wavelengths for solar energy, a combination of different materials for making solar cells would work best for energy absorption.

If a tandem solar panel could reach 30 percent efficiency, the impact on the balance-of-system cost could be enormous: only two thirds of the number of panels would be needed to produce the same amount of power as panels that are 20 percent efficient, greatly reducing the amount of roof space or land, installation materials, labor and equipment. (V. Sivaram et al "Outshining silicon . . . , Scientific American, July 2015"). The challenge is to produce good connections between semiconductors, something that has been challenging with regard to silicon because of the arrangement of silicon atoms in crystalline silicon (K. Bullis, "What Tech is Next for the Solar Industry" MIT Technology Review, 2013). The other material(s), on the silicon sublayer, also presents challenges. And in the case of perovskites film fabrication—how the film is made—is of crucial importance as it determines the film's texture, crystal structure, composition, and defect formation that collectively contribute toward over-all device performance. Furthermore, interface engineering has proven to effectively optimize device performance as it affects carrier dynamics across the entire device including charge generation, transportation, and collection. (Chen et al) As will be seen, the invention disclosed herein is directly related to all these issues.

The concept of the stacked solar cell was introduced to increase output voltage of a-Si:H solar cells. Only later it was recognized that stacked cells also offer a practical solution for improving the stabilized performance of a-Si:H based solar cells. Different terms such as tandem or dual junction or double junction solar cells are used in the literature to describe a cell in which two junctions are stacked on top of each other. A stack of three junctions is named a triple junction solar cell. The multi junction solar cell structure is far more complex than the single junction solar cell. For its successful operation there are two crucial requirements: (i) the current generated at the maximum power point has to be equal in each component cell (current matching) and (ii) an internal series connection between the component cells has to feature low electrical and optical losses. The internal series connection is accomplished at the p-n junction, where the recombination of oppositely charged carriers arriving from the adjacent component cells takes place. (M. Zeman "Advanced Amorphous Silicon Solar Cell Technologies").

The requirement of current matching reflects the fact that component cells function as current sources which are connected in series. The component cell that generates the lowest current determines the net current flowing through the stacked two terminal cell. In order to avoid current losses, each component cell should generate the same current. The current generated by a component cell depends mainly on the absorption in the absorber layer of the cell, which is determined by the thickness of the absorber. Current is matched by adjusting the thickness of the absorber layer of each component cell. (M. Zeman "Advanced Amorphous Silicon Solar Cell Technologies").

The tunnel recombination junction deals with the interface between the component cells. This interface is in fact an p-n diode. An ohmic contact between the component cells is required for proper operation of the stacked solar cell. The problem of obtaining the ohmic contact between the component cells can be resolved by fabricating a so-called tunnel recombination junction. This junction ensures that the electrons arriving at the n-type layer of the top cell and the holes arriving at the p-type layer of the bottom cell fully recombine at this junction. The recombination of the photogenerated carriers at this interface keeps the current flowing through the solar cell. A very high electric field in this reverse biased p-n junction facilitates tunneling of the carriers towards the defect states in the center of the junction. The effective recombination of the carriers takes place through these defective states. A tunnel recombination junction is usually realized by using microcrystalline silicon for at least one of the doped layers in order to obtain good ohmic contact. Another approach is to incorporate a thin oxide layer at the interface between the two component cells that serves as an efficient recombination layer. When the p-n junction functions as a good ohmic contact, the $V_{oc}$ of the stacked cell is the sum of the open circuit voltages of the component cells. (M. Zeman "Advanced Amorphous Silicon Solar Cell Technologies").

SUMMARY OF THE INVENTION

As discussed in the present invention disclosed herein, the crystalline silicon thin-film can serve as the tunneling junction, or the metal from the eutectic alloy can be oxidized to form the thin oxide layer at the interface between the two component cells that serves as an efficient recombination layer. Alternatively, the metal film can remain un-oxidized. Ohmic contacts to semiconductors are typically constructed by depositing thin metal films of a carefully chosen composition. It should be noted that in the technology invented by the late Dr. Praveen Chaudhari (referred to in the introduction), no intermediate layer between the two semiconductor materials—say silicon and perovskites—is required.

Perovskite solar cells hold an advantage over traditional silicon solar cells in the simplicity of their processing. Traditional silicon cells require expensive, multistep processes, conducted at high temperatures (>1000° C.) in a high vacuum in special clean room facilities. Meanwhile the organic-inorganic perovskite material can be manufactured with simpler wet chemistry techniques in a traditional lab environment. Most notably, methylammonium and formamidinium lead trihalides have been created using a variety of solvent techniques and vapor deposition techniques, both of which have the potential to be scaled up with relative feasibility. In vapor assisted techniques, spin coated or exfoliated lead halide is annealed in the presence of methylammonium iodide vapor at a temperature of around 150° C. This technique holds an advantage over solution processing, as it opens up the possibility for multi-stacked thin films over larger areas. Additionally, vapor deposited techniques result in less thickness variation than simple solution processed layers. However, both techniques can provide the desired result of planar thin film layers or for use in mesoscopic designs, such as coatings on a metal oxide scaffold.

As stated, ideally the perovskite material should be non-toxic and when combined with silicon, a thin-film of silicon is preferable since silicon thin-films are less expensive and easier to fabricate than the commonly used wafer (c-Si) (P. Chaudhari et al, "Heteroepitaxial silicon film growth at 600 C from an Al—Si eutectic melt", 2010). In fact, in 2014 two teams independently developed perovskite cells that swap lead for tin. The chemical formula for one of these perovskites was $CH_3NH_3SnI_3$ or MASnI or Methylammonium tin triiodide (N. Noel et al "Lead-free organic-Inorganic tin halide perovskites for photovoltaic applications"). The following invention facilitates the formation of a non-toxic lead-free perovskite/silicon thin film solar cell by providing a way of forming a tin (or other non-toxic metal such as Al, or Cu, etc. that forms a eutectic with silicon or an inorganic material) based perovskite layer on a silicon thin-film which greatly simplifies the manufacturing of a non-toxic perovskite/silicon thin-film tandem solar cell.

For application in perovskite/silicon tandem cells, the perovskite absorber layer has to be highly transparent at photon energies below its band gap. Any light absorbed in this sub-bandgap wavelength range would neither contribute to the photocurrent of the perovskite cell nor be transmitted to the silicon thin-film bottom cell, and therefore would severely limit performance.

In fact, a tandem perovskite/silicon thin-film solar cell could have efficiencies as high as 40 to 45% (this is the case if silicon is placed in tandem with any 1.65 to 1.7 eV band gap material, not just perovskites). It is advantageous to combine perovskite films that are non-toxic with silicon thin-films. A method for fabricating this structure is disclosed herein and in a corresponding publication (A. Chaudhari "High Efficiency Perovskite/Crystalline Silicon Thin-Film Tandem Solar Cell from a Highly Textured MgO [111] Buffered Glass Substrate: A Proposal", submitted for publication in Journal of Energy Challenges and Mechanics", June 2016).

Also, highest efficiencies would be expected for perovskite band gaps of 1.7-1.8 eV. Adding bromine into the perovskite material, the band gap can be tuned to higher energies, thus making it more suitable for tandem applications.

While Perovskite single junction solar cells could become cheaper than silicon wafers which currently dominate the market because they can be made at much lower temperature, the tandem perovskite/silicon thin-film allows for an even cheaper method because even when the perovskites are added to a silicon wafer for a tandem cell, the silicon wafer still needs to be made at roughly ~900 C in order to remove defects. Whereas the method of growing inorganic crystalline thin-films on glass invented by P. Chaudhari (U.S. Pat. No. 9,054,249) uses eutectics which allows for a drastic reduction in temperature, all the way down to 272° C. the eutectic temperature of tin-silicon (Sn—Si) alloy, for example. The present invention makes use of the metal which forms on the inorganic thin-film on glass (or inexpensive substrate) to form the perovskite top layer thus facilitating the formation of a tandem solar cell for high efficiency.

One of the challenges of solar cells is to produce good connections between semiconductors, something that has been challenging with regard to silicon because of the arrangement of silicon atoms in crystalline silicon (K.

Bullis, "What Tech is Next for the Solar Industry" MIT Technology Review, 2013). In this invention, the silicon (inorganic material) atoms have a preferred [111] orientation which is an advantage over polycrystalline or random orientation. The texture can also induce texture in the perovskite film formed on top, thereby improving the connection between the semiconductors. In the case of monolithic tandems, the top cell is directly processed on the bottom cell. This has the advantage of a reduced number of fabrication steps and fewer doped transparent conducting electrodes, resulting in lower manufacturing costs and less parasitic absorption; however, monolithic tandems require strict process compatibility, such that both top- and bottom-cell fabrication schemes have to be specifically adapted for monolithic tandem integration: (i) both sub cells have to be optimized to produce the same current at maximum power point, as the tandem current will be limited by the sub cell with the lower current.15; (ii) the perovskite cell may have to be processed at low temperatures for temperature sensitive bottom cells, such as the amorphous/crystalline silicon heterojunction (SHJ) cell, the silicon photovoltaic technology with currently the highest performance; and (iii) bottom cells with front surface texture are not compatible with solution processing, which is typically used for the deposition of many layers during perovskite cell fabrication.

The present invention provides a method for forming a non-toxic metal based perovskite film on an inorganic thin-film.

The present invention also provides a method of forming a tin perovskite film on a silicon thin-film on glass.

The present invention also provides a facile method of forming a tandem perovskite/silicon thin film solar cell that is non-toxic.

The present invention also provides a method of forming a tandem perovskite/silicon thin film solar cell that is non-toxic in a simple, cost effective manner.

The present invention also improves the connection between the two semiconductors in the tandem solar cell.

The present invention also induces a smooth and uniform, homogenous semiconductor bottom layer onto which the top perovskite layer is deposited.

DETAILED DESCRIPTION OF THE INVENTION

In the current invention by "perovskite" is meant an organic-inorganic metal halide material, though it should be noted that the invention is not limited to these hybrid perovskite compounds. For example, a non-organic perovskite could be used instead. The phenomenal performances of hybrid perovskites stem from the substantial characteristic properties they possess. Hybrid perovskites demonstrate a strong optical absorption, an adjustable band gap, long diffusion lengths, ambipolar charge transport, high carrier mobility, and a high tolerance of defects. The ability to tune electronic and optical properties of hybrid perovskites with such ease presents a major attraction (Q. Chen et al "Under the spotlight: The organic-inorganic hybrid halide perovskite for optoelectronic applications" Nano Today (2015) 10, 355-396).

The thickness of the subcell is the critical factor for power conversion efficiencies (PCE) of tandem devices, and that the combination layer (or intermediate layer) shows good electrical connection in these tandem devices.

Finally, it should also be noted that the invention disclosed here can be applied to any semiconductor compound that has a metal that can form a eutectic alloy with silicon or other inorganic material such as germanium. An example of such a compound is $AgBiS_2$ where Ag (silver) forms a eutectic alloy with silicon.

A good high vacuum system with two electron beam guns, is used to deposit a metal such as Sn and an inorganic material such as silicon independently. A glass substrate (or other inexpensive substrate) coated with a textured oxide such as MgO is held at temperatures between 575 and 600° C. These are nominal temperatures. It is understood to one skilled in the art that lower or higher temperatures can also be used depending upon the softening temperature of the glass substrate or the reaction kinetics of either Sn or Si with the MgO layers when used as substrates. A thin tin film of approximately 10 nm thickness is deposited first. This is followed by a Si film deposited at a rate of 2 nm per minute on top of the tin film. The silicon film nucleates heterogeneously on the MgO surface to form the desired thin film. The film can now be cooled to room temperature, where the film now comprises of two phases: tin and a relatively large grained and highly textured film of silicon on MgO. The tin diffuses to the surface of the silicon film, driven by its lower surface energy relative to the silicon surface. Rather than etching the film in a solution, which removes the Sn from the two phases, tin and silicon, leaving behind a silicon film (practiced in P. Chaudhari U.S. Pat. No. 9,054,249) the Sn in the Si—Sn film can now be used as a surface on which to deposit the other perovskite elements combining to form a tin perovskite. For the Si—Sn deposition we have used two electron beam guns as an illustrative example. It is understood to one skilled in the art that other methods such as a single gun with multiple hearths, chemical vapor deposition, thermal heating, or sputtering can also be used. For the perovskite elements, such as methylammonium halides, deposition can be by low-temperature solution methods (typically spin-coating but also others). Since low-temperature (below 100° C.) solution-processed films tend to have considerably smaller diffusion lengths, a higher temperature method may however be favorable so long as it does not melt the underlying substrate.

Since under ambient conditions the Sn2+ ion will rapidly oxidize to its more stable Sn4+ analogue, which destroys the charge neutrality of the perovskite structure and causes it to break down, preparation and sealing should ideally take place under inert atmosphere—i.e. under vacuum (N. Noel et al, "Lead-free organic-inorganic tin halide perovskites for photovoltaic applications", 2014).

Unlike Pb-based perovskite which requires heating to crystallize, the Sn perovskites crystallize at room temperature. This is actually an impediment to uniform film formation (Noel et al). Therefore, having Sn on the surface of the Si film in advance of the addition of the other elements in the perovskite, can help achieve uniformity and smoothness. In other words, the Sn layer controls the crystallization of the tin perovskite. Moreover, since the Si layer is oriented, the perovskite layer will also become oriented or textured.

The perovskite film can be deposited in the following way: Hybrid perovskites can be prepared using different deposition routes and are comprised of two main precursor components: an organic methylammonium halide cation ($CH_3NH_3X$, X=Cl, Br, I) and an inorganic lead halide species, $PbX_2$ (X=Cl, Br, I). The preparation methods for perovskite films using precursors can be categorized into three processes: 1) vacuum, 2) solution, and 3) hybrid (Chen et al). We invent none of these processes. And any of these processes known in the art can be used to complete our invention. Here, just to illustrate how the invention works, we choose vacuum deposition. Normally in this process the organic species are co-evaporated to form uniform planar perovskite films on the inorganic layer which would be silicon, in this example, but could be germanium etc. However, since in this invention the Sn (inorganic species in the perovskite) is already on the Si layer, only the organic species need to be evaporated. So the Sn layer (on the Si film) is exposed to MAI vapor to form the tin perovskite (MASnI). While it is known that perovskite film deposition can benefit from an electron separation layer, or transport layer, such as $TiO_2$, it is also known that device scenarios without a scaffold such as $TiO_2$ or electron transport layer (and hole transport layer) have achieved reasonable efficiencies (Chen et al). Moreover, it has recently been reported that silicon layers can form a tunnel junction for perovskite deposition (Mailoa et al "A 2-terminal perovskite/silicon multi junction solar cell enabled by a silicon tunnel junction", 2015). Here, instead of use of a wafer, we disclose a method of forming a tunnel junction from the silicon thin-film layers. It is known that when Al is used as a catalyst with Si, any Al impurities in the Si serve as a p-type dopant in the Si film. An n-type layer can then be added to form the tunnel junction.

As already stated, in the invention disclosed herein, the crystalline silicon thin-film can serve as the tunneling junction, or the metal from the eutectic alloy—in this case Sn—can be oxidized to form the thin oxide layer at the interface between the two component cells that serves as an efficient recombination layer. Alternatively, the metal film can remain un-oxidized. Ohmic contacts to semiconductors are typically constructed by depositing thin metal films of a carefully chosen composition.

Normally, when designing the architecture of a monolithic heterojunction perovskite silicon tandem solar cell either a tunnel junction or a recombination layer is deposited in order to electrically connect the top perovskite cell to the bottom silicon cell (McGehee et al.). In one distinctive embodiment of the invention disclosed here, the silicon film serves as a mesoporous scaffold like $TiO_2$ and a polymer (P3HT) film underneath the silicon film serves as a conducting layer following the technology invented by A. Chaudhari (U.S. Pat. No. 9,349,995 B2). The polymer film here also serves as a third semiconductor material for a triple junction solar cell for even higher efficiency.

Finally, in one embodiment of the invention, instead of using glass as a substrate, organic materials such as polyimide can be used for flexible, roll-to-roll processing. Likewise, metal tapes with texture which are flexible can be used, following processes known in the art.

EXAMPLE 1

The Sn segregates on the Si film as per process by P. Chaudhari disclosed in U.S. Pat. No. 9,054,249. Following perovskite film deposition processes known in the art, a dual source thermal evaporation system (Kurt J. Lesker, Mini Spectros) for depositing the perovskite absorbers is used to deposit the organic and inorganic components of the perovskite onto the Sn on Si. Ceramic crucibles are used in a nitrogen filled glovebox. One source deposits the organic and one source deposits the inorganic. For example, in the case of CH3NH3PbI3—xClx (mixed halide perovskite) which is proven to be an effective semiconductor absorber layer in solar cells, the organic source is methylammonium iodide and the inorganic source is PbCl2. In this invention, the methylammonium iodide is deposited from the organic source, and the Cl2 is deposited from the inorganic source, and both onto the Sn layer on the Si film (or Sn layer on the textured insulator if that is preferable). The molar ratios of these chemicals needs to be determined through experimentation as do the thicknesses of the silicon and perovskite layers (thickness determines current and absorption capabilities), but it is estimated that the silicon layer thickness would be between 20-80 µm while the perovskite layer would be under 1 µm, e.g. much thinner. As the substrate has been heated, annealing of the perovskite substrate is not necessary contrary to common practice and is a distinguishing feature of this invention. The films made using this process will be smooth and uniform since the metal (Sn) is a layer in advance of the addition of the other elements. Smoothness and uniformity are important for device performance. (Liu et al, "Efficient planar heterojunction perovskite solar cells by vapour deposition", 2013).

EXAMPLE 2

Just like Example 1, but the Sn is deposited directly on the textured buffer layer—say MgO [111]. The Sn then spreads uniformly over the substrate. The other components of the perovskite film are added. In addition to forming a uniform, homogeneous film, as the components are added the perovskite film crystallizes and replicates the [111] texture which improves the connection between the two semiconductors.

EXAMPLE 3

Following the technology invented by A. Chaudhari (U.S. Pat. No. 9,349,995 B2), a polymer film such as P3HT is deposited on the textured buffer layer—say MgO [111]—thereby obtaining texture itself. This layer is conducting. A silicon or other inorganic film is then deposited out of a a Sn—Si eutectic melt onto the polymer film at low temperature (below 400° C.) and as in the previous examples the Sn diffuses to the surface of the Si film, forming a very thin, uniform layer, which can now be used as the metal in the perovskite film as in the previous examples. The difference here is that the Si film serves as a scaffold (mesoporous) like $TiO_2$ and a polymer film underneath is a conducting layer while also serving as a third semiconductor material for a triple junction solar cell for even higher efficiency.

EXAMPLE 4

Just like example 1, but the substrate used is organic, such as polyimide, and is flexible and is thus capable of roll-to-roll (R2R) manufacturing.

What is claimed is:
1. A method of making a non-toxic perovskite/inorganic thin-film tandem solar cell comprising the steps of:
    depositing a textured oxide buffer layer on substrate;
    depositing a metal-inorganic film from a eutectic alloy on said buffer layer; and
    depositing perovskite elements on said metal-inorganic film, forming a perovskite layer based on a metal from said metal-inorganic film, incorporating said metal into said perovskite layer.
2. The method of claim 1, wherein the buffer layer is textured.
3. The method of claim 1, wherein the inorganic film is textured.
4. The method of claim 1, wherein the metal is Sn (tin).
5. The method of claim 1, wherein the inorganic film is Si (silicon).

6. The method of claim 1, wherein the perovskite layer is tin based.

7. The method of claim 1, wherein the perovskite layer is textured.

8. The method of claim 1, wherein said perovskite layer is MASnI.

9. The method of claim 1, further comprising forming a silicon film and using said silicon film as a tunnel junction.

10. The method of claim 1, wherein improving the connection between the two semiconductor materials with the texture.

11. The method of claim 1, wherein said metal film serves as an ohmic contact between the metal-inorganic layer and the perovskite layer in the tandem solar cell.

12. The method of claim 1, wherein said substrate is glass.

13. The method of claim 1, wherein said substrate is organic and flexible.

14. The method of claim 1, wherein said substrate is a metal tape.

15. The method of claim 1, wherein the thickness of said inorganic film is less than 1 μm.

16. The method of claim 1, wherein the thickness of said inorganic film is greater than 1 μm.

17. The method of claim 1, wherein the thickness of said perovskite layer is less than 1 μm.

18. The method of claim 1, wherein the thickness of said perovskite layer is greater than 1 μm.

19. The method of claim 5, wherein the silicon film serves as a scaffold and a polymer film underneath the silicon film serves as a conducting layer and a third semiconductor material for a triple junction solar cell.

\* \* \* \* \*